United States Patent [19]

Beling

[11] Patent Number: 4,700,123
[45] Date of Patent: Oct. 13, 1987

[54] POWER DISTRIBUTION SYSTEMS AND MEANS FOR CONTROL THEREOF

[75] Inventor: Thomas E. Beling, Saxonville, Mass.

[73] Assignee: Sigma Instruments, Inc., Braintree, Mass.

[21] Appl. No.: 776,910

[22] Filed: Sep. 17, 1985

[51] Int. Cl.[4] .............................................. G05F 1/70
[52] U.S. Cl. .................................. 323/210; 323/215; 174/139
[58] Field of Search ........................ 323/205, 208–211; 324/96, 127; 174/139; 361/301, 303

[56] References Cited

U.S. PATENT DOCUMENTS

| 3,312,895 | 4/1967 | Garbuny | 174/139 |
| 3,331,023 | 7/1967 | Adkins et al. | 324/127 |
| 3,363,174 | 1/1968 | Hudson et al. | 174/139 |
| 3,386,059 | 5/1968 | Stein, Jr. et al. | 324/127 X |
| 3,836,855 | 9/1974 | Zaleski | 174/139 X |

FOREIGN PATENT DOCUMENTS 1514009  3/1967  France ................................ 174/139

Primary Examiner—Peter S. Wong
Attorney, Agent, or Firm—Leo Stanger

[57] ABSTRACT

In a power distribution system, power line insulators have three electrodes, two of which are connected to the line and to ground, and the third of which forms a capacitively stepped down voltage corresponding to the line voltage, and use sensing coils to measure current. The sensing coils are inversely connected and differentially located to suppress noise.

20 Claims, 5 Drawing Figures

POWER DISTRIBUTION SYSTEMS AND MEANS FOR CONTROL THEREOF

BACKGROUND OF THE INVENTION

This invention relates to power distribution systems, and particularly to arrangements for measuring parameters of power lines and for using the measurements to control the conditions of the lines.

To maximize efficiency of energy use, and meet growing demands, utilities must automatically adjust distribution by detecting conditions as they happen. This involves simultaneously measuring of currents and voltages so that phase conditions can be determined, and using the results for control of the system. Methods and means of measurement are shown in U.S. Pat. Nos. 3,363,174 and 3,386,059. However, these are inadequate for future demands.

SUMMARY OF THE INVENTION

An object of the invention is to improve such systems.

Another object is to measure high-power voltages and currents simultaneously with simple means.

According to a feature of the invention, one of three electrodes formed on an isulation post is connected to a power line and another grounded. The third is located between the other two and produces a capacitively stepped down voltage representing the line voltage.

According to another feature, one of the electrodes surrounds a current sensing coil.

According to another feature, control means respond to the voltage, the current or both to vary the conditions of the power in the line.

According to another feature, noise in current measurements is suppressed by arranging measuring coils differentially in the insulators and connecting them in differential relationship.

These and other features of the invention are defined in the claims. Other objects and advantages of the invention are set forth in the following detailed description, when read in light of the following drawings.

DESCRIPTION OF PREFERRED EMBODIMENTS

Figure 1:
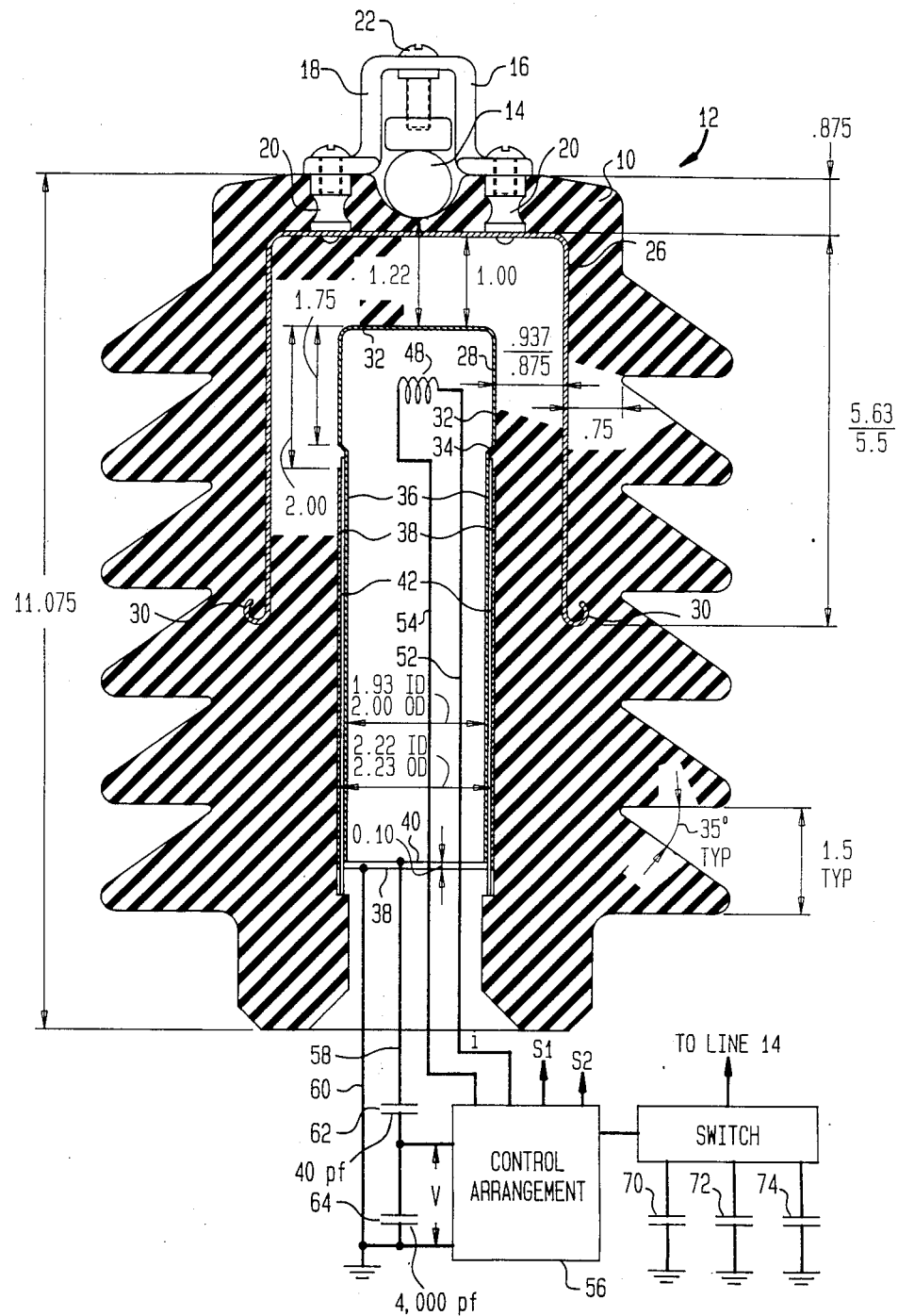
FIG. 1 is a sectional schematic view of a system embodying the invention.
Figure 2:
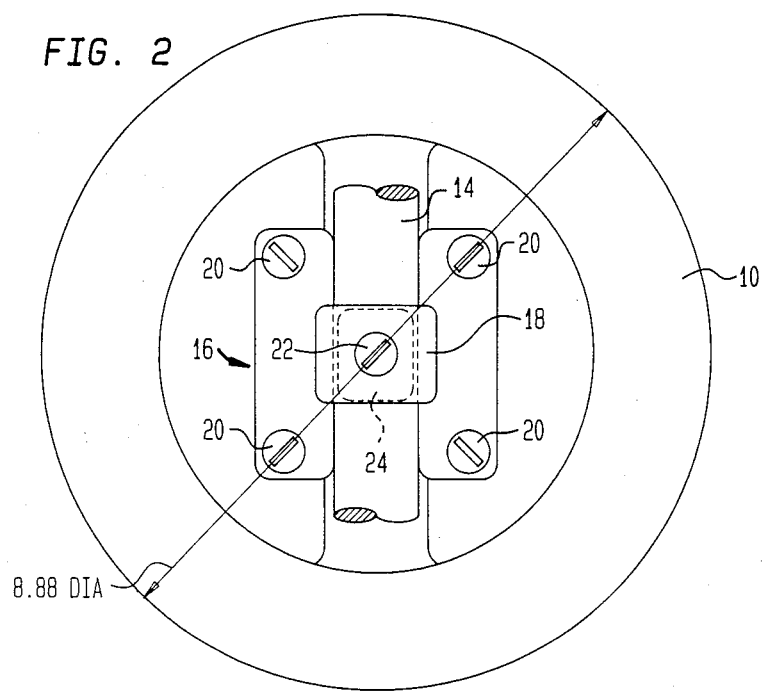
FIG. 2 is a top view of an insulator in FIG. 1.

In FIGS. 1 and 2, an insulating support 10 serves as the housing of an electrical coupling device 12 coupled to a power line 14 of one phase of a three-phase power distribution system. The electrical coupling device 12 permits metering, relaying, phase control or other control operations of the system in accordance with the current and voltage and their respective phases of the line 14 with respect to ground. On the support 10, a securing arrangement 16 is composed of a conductive metal cap 18, connectors 20, a bolt 22, and a contactor 24 that contacts the line 14 and connects it to a cylindrical high-voltage electrode 26 embedded in the support 10. The latter is composed of Polysil, a material composed of 90% silicon dioxide, plastic, MMA, and Lucite polyester. The electrode 26 is in the form of a screen of non-ferrous metal such as copper or aluminum, which does not interfere significantly with magnetic fields varying at power frequencies such as 50 Hz or 60 Hz.

Mounted in the interior of the support 10 is a cylindrical shielding electrode 28 extending downward below the lower curled-up skirt 30 of the electrode 26. The shielding electrode 28 forms an upper cup 32 of one diameter and then narrows at a neck 34 to form a narrower tube 36. Surrounding the tube 36 along its length is a cylindrical ground electrode 38 that extends below the shielding electrode 28 to form a spark gap 40. A preformed cylindrical sleeve 42 of Polysil insulation separates the tube 36 from the ground electrode 38 and holds the tube 36 within the support 10.

Within the cup 32 a coil 48 is wound around an axis such that it senses the varying magnetic field formed by the current through the line 14, and hence the alternating current through the line. Suitable conductors 52 and 54 bring the current in the sensor 48 to a control arrangement 56.

Two conductors 58 and 60 connect the shielding electrode 28 and ground electrode 38 across a capacitive voltage divider composed of a 40 pf (picofarad) capacitor 62 and a 4,000 pf capacitor 64. The latter is connected to the control arrangement 56. The conductor 60 grounds the shielding electrode 28.

The control arrangement 56 measures and indicates the voltage v at the capacitor 64, the current i in conductors 52 and 54, compares the current i and voltage v to determine the phase, and controls a switch 66 that successively adds or subtracts capacitors 70, 72, 74, etc. from the line 14 to ground.

The shielding electrode is also formed of aluminum, copper or other non-ferrous metal, or any conductor that does not interfere significantly with 50 Hz or 60 Hz magnetic fields.

In operation the line 14 carries a high voltage such as 20,000 volts at 50 Hz or 60 Hz. The current through the line forms a sinusoidally varying circular magnetic field about the line. This field induces currents in the sensor coil 48 proportional to the current through the line 14. The resulting current, or voltage across the coil 48 appears at the control arrangement 56.

Neither the shielding electrode 28 nor the screen impede the circular magnetic field about the line 14 because the metals of which they are made, e.g. copper or aluminum, do not significantly affect 50 Hz or 60 Hz magnetic fields. Hence the magnetic fields are freely sensed by the coil 48.

At the same time the electrode 26, because it is connected to the line 14 by the arrangement 16, forms a capacitive voltage divider with the shielding electrode 28 and the ground electrode 38. That is, the electrode 28 forms one series capacitor of about 26 pf with the electrode 26 and another series capacitor of about 780 pf with the ground electrode 38. The output voltage is taken across the electrode 28 and the ground electrode 38. The input appears across the electrode 26 and the ground electrode 38. This divides the 20,000 volts RMS from line 14 to ground by 30. The divider output at line 58 is thus 666 volts RMS. The 40 pf- and 4,000-pf capacitors 62 and 64 further divide this voltage by 100 to 6.66 volts.

The control arrangement 56 now measures, indicates, and compares the current indicated at conductors 52 and 54 and the voltage across capacitor 64 to establish the phase. The control arrangement now switches in capacitors 70, 72, 74, etc. to vary the phase of the voltage to current. It can also send signals S1 and S2 to allow other adjustments.

Both the capacitor formed by the electrodes 26 and 28 and the capacitor formed by electrodes 28 and 38 have dielectrics made of Polysil. Polysil has a temperature coefficient of capacitance of plus or minus 5% to 7% per 100 degrees centigrade. Because both capacitor dielectrics are made of the same material, Polysil, they compensate for any changes in capacitance and hence in the measurement of voltage.

Figure 3:
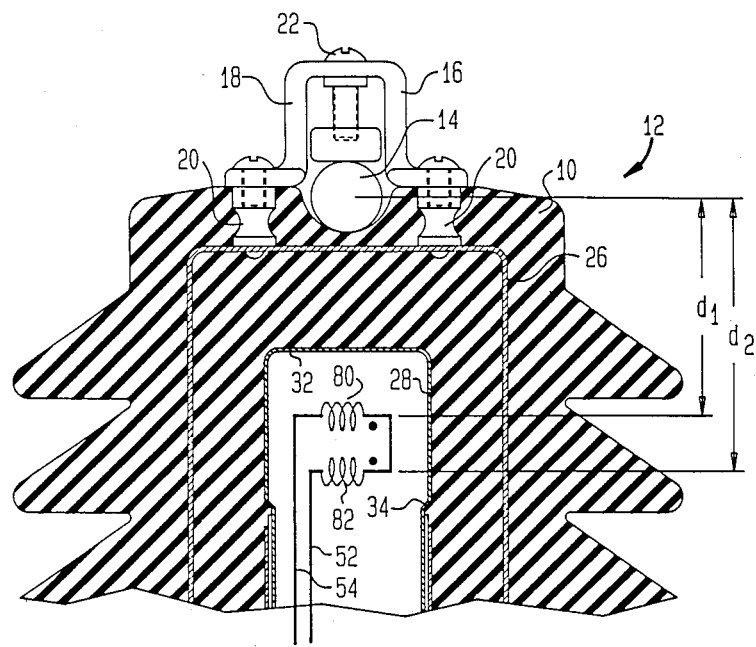
FIG. 3 is a schematic view of another embodiment of the invention.

According to another embodiment of the invention, the coil 48 of FIGS. 1 and 2 is replaced by two coils 80 and 82, spaced radially of the line 14 and connected in subtractive relation as shown in FIG. 3. Both coils 80 and 82 are wound along axes transverse to the line 14, along the magnetic flus path to sense the varying magnetic field formed by the current through the line 14. The closer of the coils to line 14, i.e., 80, produces an output greater than that of the coil 82 at the lines 52 and 54. The latter produce a value that is proportional to the difference. The structure suppresses noise from other lines, i.e., phases of the system, or from other sources. Yet the output at line 52 and 54 is still representative of the current in the line 14.

This can best be understood by considering that voltage components v1 and v2 at the coils 80 and 82 arising from current in the line 14 are substantially different because the distances d1 and d2 to the line 14 are substantially different. On the other hand, the noise signals n1 and n2 arising from a distant source, such as the line current of another phase spaced far from both coils 80 and 82, are almost the same; i.e., $n1=n2$. Hence the voltage across coil 80 is $v1+n1$ and the voltage across the coil 82 is $v2+n2$. The total output VT at lines 52 and 54 is now $v1+n1-(v2+n2)=v1+n1-v2-n2$. But $n1=n2$. Hence $VT=v1+n1-v2-n2$. Thus $VT=v1-v2$. This effectively suppresses the noise n1 and n2.

Figure 4:
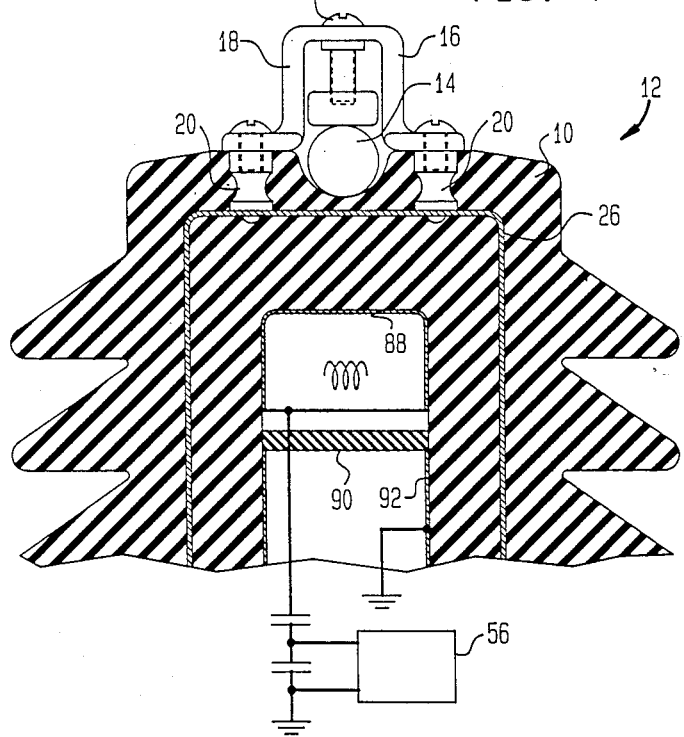
FIG. 4 is a somewhat schematic view of yet another embodiment.

FIG. 4 shows another embodiment of the invention in somewhat schematic form. There the insulator 10 is again connected to the screen electrode 26. However, an electrode 88, corresponding to the electrode 28, extends only somewhat beyond the coil 48 (or the coils 80 and 82). A Polysil insulator 90 separates the electrode 88 from another cylindrical ground electrode 92 corresponding to the electrode 38. Here again the electrode 26 forms a capacitor with the electrode 88, and the latter forms a series capacitor with the electrode 92.

These embodiments overcome inaccurate readigs that could result from the presence of rain or contaminants. Rain or contaminants alter the equipotential distribution that is normally highly non-uniform with equipotential lines crowded at the top and bottom of the insulator 10. The grounding electrodes 38 and 92 prevent the long electrode 28 from being affected by the rain-induced equipotential redistribution, and the short electrode 88 from being affected by stress concentration in the insulation material.

Figure 5:
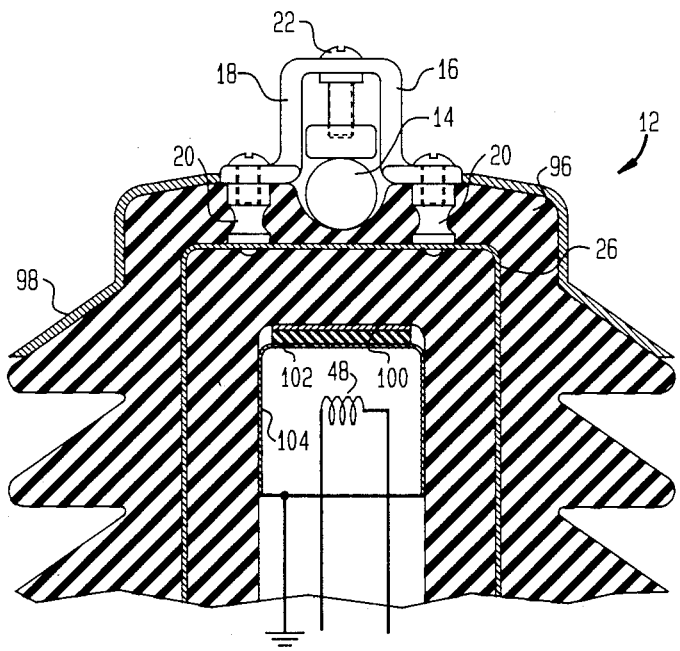
FIG. 5 is a sectional view of another embodiment.

Another embodiment of the device 12 is shown in FIG. 5. Here a porcelain insulator 96 is covered by an external semiconductor glaze 98 in common use to recude radio interference problems. A thin metal disc 100 of aluminum or copper therefore is placed on top of an insulator 102 and deals with the problem of rain or contaminants. A metal cup 104 of aluminum or copper under the insulator encloses the coil 48 (or coils 80 and 82) and is grounded. The short top electrode prevents voltage stresses at the bottom of the cup.

While embodiments of the invention have been described in detail, it will be evident that the invention may be practical otherwise without departing from its spirit and scope.

What is claimed is:

1. A power distribution system comprising:
   a plurality of of distribution lines;
   a coupling device coupled to one of said lines;
   said coupling device having
      an insulating member of substantially cylindrical shape;
      a cylindrical electrode mounted on the insulating member and connected to the one of the lines;
      a second electrode within the insulating member and spaced from the first electrode;
      a third electrode within the insulating member and insulated from the second electrode;
   grounding means for grounding one of said second and third electrodes;
   control means connected to said output means for varying the conditions of the distribution lines on the basis of the output;
   said first and second and third electrodes being insulated from each other.

2. A system as in claim 1, wherein:
   said coupling device includes a coil for measuring current in the one of said lines;
   said second electrode surrounds said coil; and
   said control means are connected to the coil to respond to the coil.

3. A system as in claim 1, wherein:
   said second and third electrodes are cylindrical and coaxial with said first electrode.

4. A system as in claim 1, wherein:
   said first, second, and third electrodes form a capacitive voltage divider between the one of said lines and ground, said voltage divider having a voltage output at said output means.

5. A system as in claim 1, wherein:
   said first, second, and third electrodes form a first capacitive voltage divider between the one of said lines and ground, said voltage divider having a voltage output at said output means; and
   said control means includes a second capacitive voltage divider across the output and ground of the voltage output of said first voltage divider.

6. A system as in claim 1, wherein:
   said first, second, and third electrodes form a first capacitive voltage divider between the one of said lines and ground, said voltage divider having a voltage output at said output means; and
   said control means includes a second capacitive voltage divider across the output and ground of the voltage output of said first voltage divider;
   said control means further including a plurality of capacitors and switch means for connecting selected ones of said capacitors across one of said lines.

7. A system as in claim 2, wherein:
   said second and third electrodes are cylindrical and coaxial with said first electrode.

8. A system as in claim 2, wherein:
   said first, second, and third electrodes form a capacitive voltage divider between the one of said lines and ground, said voltage divider having a voltage output at said output means.

9. A system as in claim 2, wherein:
said first, second, and third electrodes form a first capacitive voltage divider between the one of said lines and ground, said voltage divider having a voltage output at said output means; and
said control means includes a second capacitive voltage divider across the output and ground of the voltage output of said first voltage divider.

10. A system as in claim 2, wherein:
said first, second, and third electrodes form a first capacitive voltage divider between the one of said lines and ground, said voltage divider having a voltage output at said output means; and
said control means includes a second capacitive voltage divider across the output and ground of the voltage output of said first voltage divider;
said control means further including a plurality of capacitors and switch means for connecting selected ones of said capacitors across one of said lines.

11. An insulating coupler for coupling to a distribution line, comprising:
an insulating member of substantially cylindrical shape;
a cylindrical electrode mounted on the insulating member for connection to the one of the lines;
a second electrode within the insulating member and spaced from the first electrode;
a third electrode within the insulating member and insulated from the second electrode;
said first and second and third electrodes being insulated from each other.

12. A coupler as in claim 11, wherein:
said insulating member embraces a coil for measuring current in the one of said lines;
said second electrode surrounds said coil.

13. A coupler as in claim 11, wherein:
said second and third electrodes are cylindrical and coaxial with said first electrode.

14. A coupler as in claim 11, wherein:
said first, second, and third electrodes form a capacitive voltage divider between the line and ground, said voltage divider having an output between said second and third electrodes.

15. A coupler as in claim 12, wherein:
said second and third electrodes are cylindrical and coaxial with said first electrode.

16. A coupler as in claim 12, wherein:
said first, second, and third electrodes form a capacitive voltage divider between the line and ground, said voltage divider having an output between said second and third electrodes.

17. For a power distribution system having a plurality of distribution lines, a control system, comprising:
a coupling device for coupling to one of said lines;
said coupling device having
an insulating member of substantially cylindrical shape;
a cylindrical electrode secured by the insulating member and connected to the one of the lines;
a second electrode within the insulating member and spaced from the first electrode;
a third electrode within the insulating member and insulated from the second electrode;
grounding means for grounding one of said second and third electrodes; and
control means connected to said output means for varying the conditions of the distribution lines on the basis of the output;
said first and second and third electrodes being insulated from each other.

18. A system as in claim 17, wherein:
said coupling device includes a coil for measuring current in the one of said lines;
said second electrode surrounds coil, and
said control means are connected to the coil to respond the coil.

19. A system as in claim 17, wherein:
said second and third electrodes are cylindrical and coaxial with said first electrode.

20. A system as in claim 1, wherein:
said coupling device includes a pair of differentially connected coils coil for measuring current in the one of said lines;
said second electrode surrounds said coil; and
said control means are connected to the coils to respond to the coil;
said first, second, and third electrodes form a capacitive voltage divider between the one of said lines and ground, said voltage divider having a voltage output at said output means.

* * * * *